US007005713B2

(12) United States Patent
Mayer et al.

(10) Patent No.: US 7,005,713 B2
(45) Date of Patent: Feb. 28, 2006

(54) ANNULAR SEGMENTED MOSFET

(75) Inventors: Donald C. Mayer, Palos Verdes Estates, CA (US); Jon V. Osborn, Thousand Oaks, CA (US); Ronald C. Lacoe, Newbury Park, CA (US); Everett E. King, Granada Hills, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 10/725,685

(22) Filed: Dec. 1, 2003

(65) Prior Publication Data

US 2005/0116295 A1   Jun. 2, 2005

(51) Int. Cl.
*H01L 29/76* (2006.01)
*H01L 29/94* (2006.01)

(52) U.S. Cl. .................. 257/382; 257/383; 257/401; 257/412

(58) Field of Classification Search ............. 257/382, 257/383, 401, 412
See application file for complete search history.

(56) References Cited

U.S. PATENT DOCUMENTS 3,803,461 A * 4/1974 Beneking .................... 257/280

* cited by examiner

*Primary Examiner*—Hung Vu
(74) *Attorney, Agent, or Firm*—Derrick Michael Reid

(57) ABSTRACT

An annular segment MOSFET structure has reduced drain electric fields for a given applied voltage and dimensional sizing for improved reliability from damage by reducing high energy hot carriers laterally traversing the channel by reducing the intensity of electric fields in the MOSFET structure by creating diverging electric field lines with decreased electric field strength at the drain, while enabling compact integrated layouts of multiple MOSFETs within a square area of surface silicon.

17 Claims, 3 Drawing Sheets

QUARTER CIRCLE ANNULAR N-CHANNEL MOSFET

STRAIGHT N-CHANNEL MOSFET (PRIOR ART)

CIRCULAR N-CHANNEL MOSFET (PRIOR ART)

QUARTER CIRCLE ANNULAR N-CHANNEL MOSFET

EIGHTH CIRCLE ANNULAR N-CHANNEL MOSFET

ANNULAR SEGMENTED MOSFET

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of semiconductor integrated circuits. More particularly, the invention relates to semiconductor integrated circuit MOSFET devices having annular topographies.

BACKGROUND OF THE INVENTION

The scaling of metal oxide silicon (MOS) integrated circuits has followed a relentless decrease in feature sizes with a corresponding increase in data throughput per chip for the past thirty years. However, the reduction in power supply voltages in each new generation has not scaled nearly as rapidly as the reduction in feature sizes of the MOS integrated circuits. This mismatch in downward scaling between feature sizes and applied voltages has resulted in substantial increases in electric fields in MOS integrated circuits, particularly in the channels and oxide layers of metal oxide silicon field effect transistors (MOSFETs).

Referring to FIG. 1A, a prior art straight MOSFET is shown having uniform electric fields extending across the gate from the source to the drain. There is an insulating oxide layer between the gate and the channel region in the silicon. As the dimensions of the straight MOSFET decrease, the strength of the electric fields increases, for a given applied voltage. In a conventional MOSFET, current is carried by inversion layer electrons moving under the influence of the lateral electric field in the channel. The channel has two opposing ends that are parallel to each other. The lateral electric field in the MOSFET channel that causes the transistor current to flow varies monotonically from the source, where the field is low, to the drain, where the field peaks sharply. The high field at the drain is well known to cause damage to the MOSFET as carriers are accelerated by the high electric field and some carriers are disadvantageously scattered into the gate oxide leading to damage and poor reliability. This damage limits the current capacity of the MOSFET, and will eventually lead to failure of the MOSFET. The conventional use of lightly doped drains in MOSFET channels has reduced the channel electric fields. However, as the dimensions of the MOSFET features continue to shrink in size, the electric fields will continue to correspondingly increase.

Referring to FIG. 1B, an experimental circular MOSFET has a gate that is curved and extends between the source and drain. The circular MOSFET has a gate structure in the shape of a circle. With a source in the center of the circular gate and a drain on the outside of the circular gate, the electric fields can diverge across the gate from the source to the drain so as to decrease the electric field at the edge of the drain. When the drain is in the center of the circular gate and the source is outside the circular gate, the electric fields into the drain would converge disadvantageously producing an increasing electric field at the edge of the drain. A circular MOSFET has a gate that has no ends, and the circular gate is continuous. A circular MOSFET disadvantageously uses a relatively large amount of silicon square area, relative to the gate size. A conventional serpentine MOSFET, not shown, has a gate with semicircle-curved portions. The serpentine MOSFET structure has one hundred and eighty degree bends that are alternating inflection curve structures. That is, the serpentine MOSFETs have a plurality of one hundred and eighty degree curved bends. The gate is curved one way, and then curved the other way. At each point of curvature change is a curve inflection point. Hence, the serpentine MOSFET has a plurality of curve inflections along the length of the gate. The serpentine MOSFET has a gate and a channel that has two opposing channel ends that are parallel to each other. The channel ends of the gates are defined by two opposing locations under the gate where the underlying channel silicon ends. The semicircle MOSFET has a gate that has two opposing channel ends that are in alignment as well as being parallel to each other. The semicircle MOSFET has a gate and channel in the shape of a horseshoe. The serpentine MOSFET would have both converging and diverging electric fields across the gate at respectively alternating curved-gate portions. As such, the serpentine MOSFET has alternating gate-inflecting portions providing both diverging and converging electric fields. The converging electric field lines disadvantageously provide high electric fields into the drain in the alternating portions of the gate. The semicircle and serpentine MOSFET also disadvantageously require a large relative square area of silicon. These and other disadvantages are solved or reduced using the invention.

SUMMARY OF THE INVENTION

An object of the invention is to provide an annular segment MOSFET structure.

Another object of the invention is to provide an annular segment MOSFET structure having diverging electric field lines between the source and drain of the MOSFET.

Yet another object of the invention is to provide an annular segment MOSFET structure having diverging electric field lines between the source and drain of the MOSFET for reducing the energy of hot carriers injected into the gate insulating oxide layer over the channel.

Still another object of the invention is to provide an annular segment MOSFET structure with a curved gate having diverging electric field lines between the source and drain of the MOSFET for reducing the energy of hot carriers injected into the oxide layer for improved reliability of the MOSFET.

Yet a further object of the invention is to provide an annular segment MOSFET structure with a curved gate having an arc length less than a semicircle and having diverging electric field lines between the source and drain of the MOSFET for reducing the energy of hot carriers injected into the oxide layer for improved reliability of the MOSFET.

Yet a further object of the invention is to provide an annular segment MOSFET structure with a curved gate having an arc length less than a semicircle and having diverging electric field lines between the source and drain of the MOSFET for reducing the energy of hot carriers injected into the oxide layer for improved reliability of the MOSFET and for providing high density integration of MOSFETs on a square area of silicon.

The present invention is directed to improving the reliability of MOSFETs while enabling high-density integration of the MOSFETs through the use of annular segment curved gates. An annular segment MOSFET has a curved gate so as to improve reliability of the MOSFET by reducing the electric field strength between the source and drain and into the drain of the MOSFET while enabling a high integration density. Discovery is made that diverging electric fields into the drain of MOSFETs tends to lower the high energy of the hot carriers that are injected into the drain so as to lead to a significant improvement of the reliability of the MOSFET. With lower electric fields, the velocity of the hot carriers into the drain is decreased with decreased energy leading to less damage of the oxide layer with a corresponding improvement in reliability. By sufficiently diverging the electric fields through the use of the annular segment gate structure, the electric fields diverge into the drain with a corresponding reduction in the electric field strength so as to reduce the energy of the hot carriers injected into the drain so as to minimize damage of the oxide layer for improved reliability and extended operational life of the MOSFET. The annular segment structure provides improved reliability while preserving a high integration density.

In the general form of the invention, the gate is curved without an opposing curve inflection and the arc length of the curved gate is less than a circle, and preferably less than a semicircle. In the preferred form, a quarter-circle annular segment structure and eighth-circle annular segment structure are used to enable both improved reliability while preserving the high integration density of conventional straight MOSFET structures. These and other advantages will become more apparent from the following detailed description of the preferred embodiment.

DETAILED DESCRIPTION OF THE PREFERRED EMBODIMENT

Figure 1A:
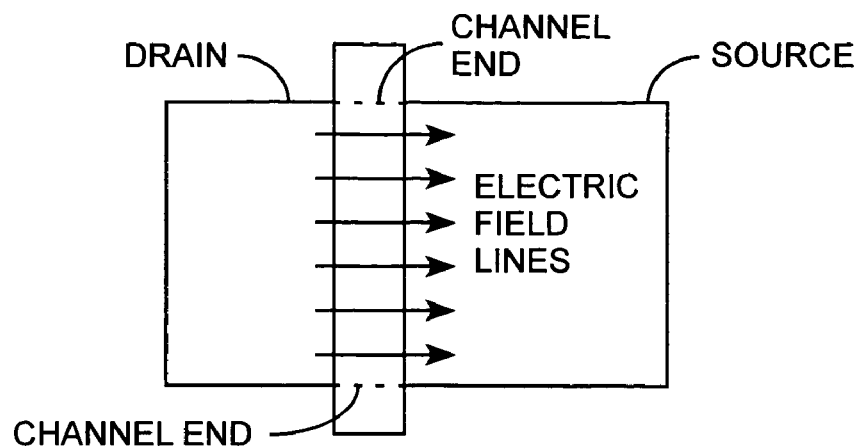
FIG. 1A depicts a prior art straight N-channel MOSFET.
Figure 1B:
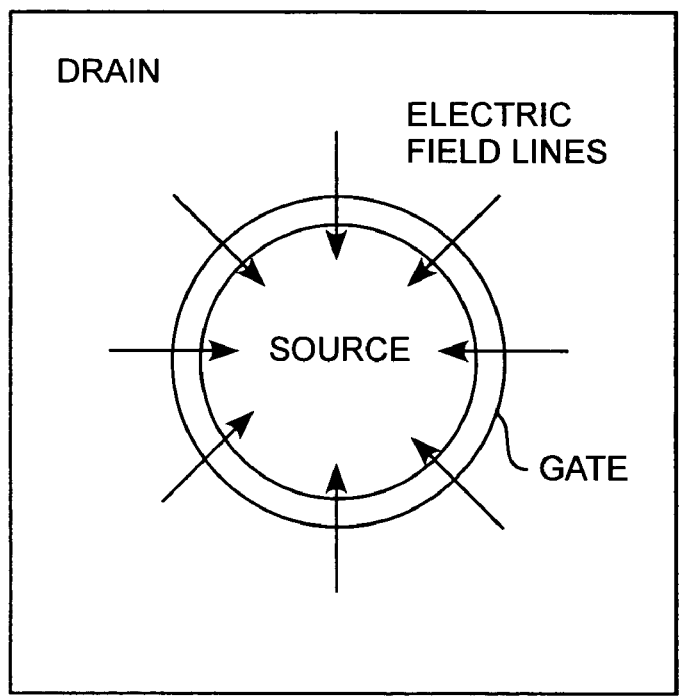
FIG. 1B is depicts a prior art circular N-channel MOSFET.
Figure 2A:
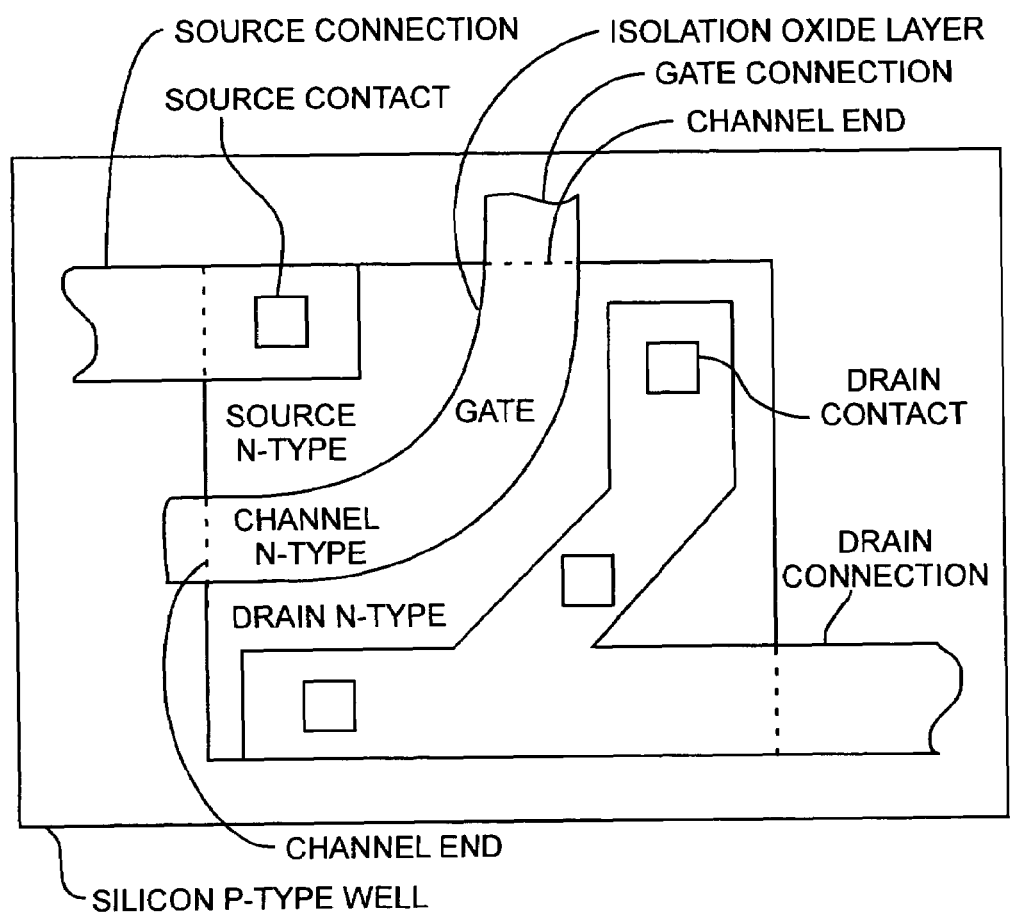
FIG. 2A depicts a quarter-circle annular N-channel MOSFET.
Figure 2B:
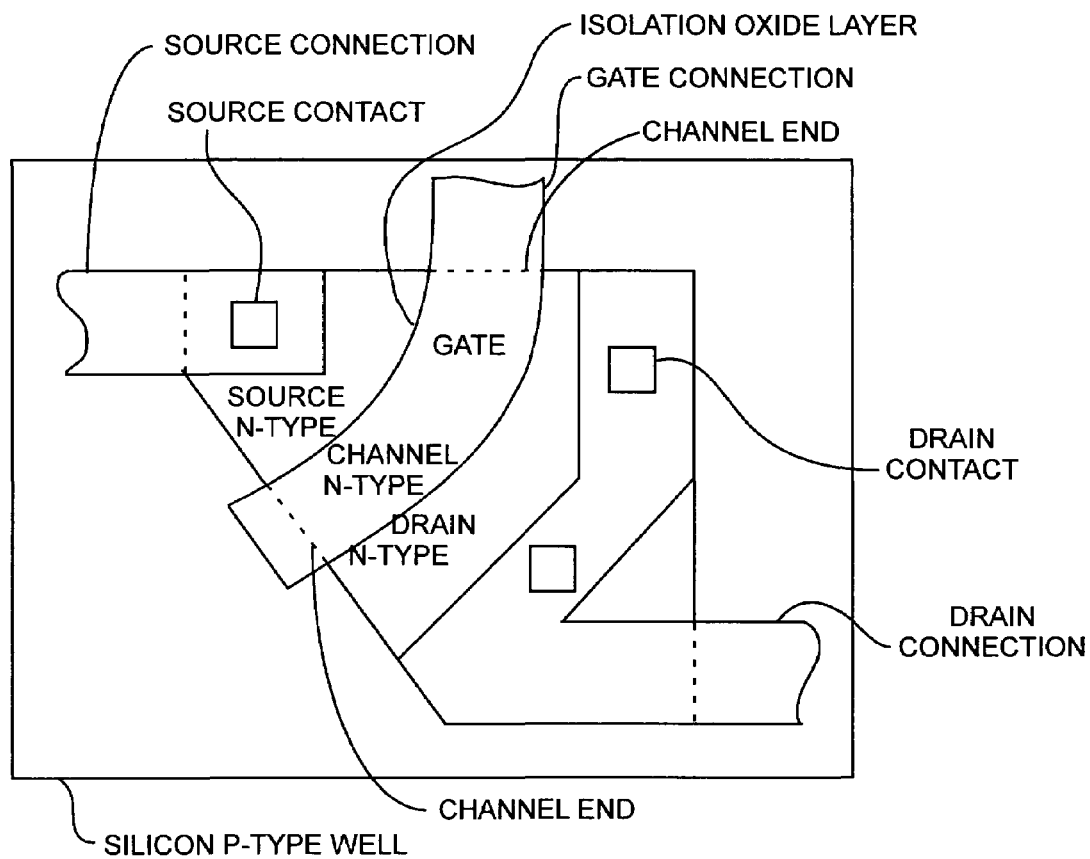
FIG. 2B depicts an eighth-circle annular N-channel MOSFET.

An embodiment of the invention is described with reference to the figures using reference designations as shown in the figures. Referring to FIGS. 2A and 2B, a quarter circle annular segment metal oxide silicon field effect transistor (MOSFET) is shown, and an eighth circle annular segment MOSFET is shown, respectively. These two preferred annular segment MOSFETs are generally characterized as having a curved noninflecting gate structure that is curved to be less than a semicircle. A source connector is a conductive interconnect, preferably made of a metal such as aluminum, tungsten, or titanium, and having a source contact that makes contact with and is disposed over n-type silicon. A gate is a conductive material disposed over a channel region of the n-type silicon. Between the gate and the channel region of the n-type silicon is disposed an oxide layer, as is conventional practice. A drain connector is a conductive interconnect preferably having a plurality of drain contacts that make contact with and are disposed over the n-type silicon. Between the gate channel under the gate and the source contact is a source made of n-type silicon. Between the gate channel under the gate and the drain contacts is a drain made of n-type silicon. The source and drain are portions of n-type silicon that are isolated by a surrounding p-type silicon well. The gate extends over the p-type silicon. The channel is formed by inversion of the silicon under the gate from p-type to n-type by an applied gate voltage. The gate extends slightly beyond the source and drain edges for reducing edge affects. The channel ends of the gate are defined by extension of the source and drain edges under the gate. In operation, a voltage potential is applied between the source connector and the drain connector so as to establish the electric field extending between the source and the drain. Conduction of current between the source and drain through the channel is controlled by a gate voltage applied to the gate.

The quarter circle gate shown in FIG. 2A has a noninflecting curve shape that preferably forms a ninety-degree arc for forming a quarter circle annular segment MOSFET. The eighth circle gate shown in FIG. 2B has a noninflecting curve shape that preferably forms a forty-five degree arc for forming an eighth circle annular segment MOSFET. Because the gate is made of a noninflecting curved structure partially circumscribing the source, a source radial distance from source contact to the inside edge of gate where the source abuts the gate channel is less than a drain radial distance from the source contact to the outside edge of the gate where the gate channel silicon abuts the drain silicon. That is, the source radial distance is less than the drain radial distance, which produces a diverging electric field effect. As such, electric field lines extending between the source and the drain diverge thereby reducing the electric field intensity at the drain. The reduction of the electric field serves to reduce the energy of the hot carriers so as to reduce hot carrier damage of the insulating oxide layer between the gate and channel region. The ends of the gate extending over the p-type well produce edge effects that insignificantly distort the uniformly diverging electric fields extending from the source to the drain. However, gate edges do modestly reduce radiation immunity of these annular segment MOSFETs. Because the preferred arc length is substantially less than a complete semicircle, the MOSFET device can be aligned during processing for maximum integration density. Particularly, the gate is curved without an opposing inflection curvature portion.

Significantly, in this compact annular segment MOSFET structure, the two opposing ends of the noninflecting-curved gate are neither in alignment with each other nor parallel to each other. The gate is disposed over the channel. One end of the gate with an edge extends slightly over the p-type silicon well. On the opposing end of the gate, the gate extends over the p-type well to make an external connection to a gate control voltage. The channel ends of the gate are defined by the underlying channel where the n-type silicon channel ends. The curved gate and corresponding channel between these two opposing channel ends are curved and noninflecting. These channel ends are at differing relative angles. In the case of the quarter circle annular segment MOSFET, the channel ends are at ninety degrees relative to each other and are thus neither parallel to each other, nor in alignment to each other. In the case of the eighth circle annular segment MOSFET, the channel ends are at forty-five degrees relative to each other and are thus neither parallel to each other, nor in alignment to each other. In both cases, the channel is defined by a noninflecting curve extending between nonparallel nonaligned channel ends.

Similar p-type MOSFETs can be likewise constructed with an inner electrode, a curved gate, and an outer electrode. In the preferred form of p-type MOSFETs, the inner electrode is the source and the outer electrode is the drain. The electric field lines are spread out, that is, diverge, as the electric field extends towards the outer electrode for reducing the drain electric field for the same applied voltage and channel length. When the outer electrode is selected as the drain in a p-type silicon MOSFET, and the inner electrode is selected as the source, the electric fields at the drain likewise are reduced for reducing hot-carrier energy.

It should now be apparent that diverging electric field strength is realized by forming a noninflecting-curved gate between an inner electrode and an outer electrode. While the preferred form uses a noninflecting curved structure that is a portion of the circle, other noninflecting curved structures, such as a portion of an ellipse or parabola or other curved structures, can be used so long as curved structure is noninflecting so as to diverge the electric field extending between the source and drain. The diverging electric field reduces hot carrier energy for reducing hot carrier damage of the oxide between the gate and channel. In the preferred form, n-type silicon is us d for forming an inner source electrode and an outer drain electrode. The preferred form provides improved reliability of the MOSFET while preserving high integration densities. The MOSFET can be made of differing materials, but is preferably made using conventional MOS processes and mat rials. Those skilled in the art can make enhancements, improvements, and modifications to the invention, and these enhancements, improvements, and modifications may nonetheless fall within the spirit and scope of the following claims.

What is claimed is:

1. A MOSFET for receiving an applied voltage and a gate voltage, the MOSFET comprising,
   a first terminal in a semiconductor material,
   a gate terminal receiving the gate voltage, the gate being disposed over a channel of the semiconductor material, the gate and channel being curved defined by a gate curvature, the gate being insulated from the semiconductor material, the channel having two channel ends, the two channel ends being nonparallel nonaligned channel ends, the curve of the gate and the channel are noninflecting,
   an insulator disposed between the gate and the semiconductor material, and
   a second terminal in the semiconductor material, the applied voltage extends between the first terminal and the second terminal, the gate voltage serving to control conduction between the first terminal and the second terminal in the presence of the gate voltage, the applied voltage serving to establish a diverging electric field extending from the first terminal through the channel to the second terminal, the MOSFET being a triode MOSFET, the gate terminal and second terminal are coextensive in length.

2. The MOSFET of claim 1 wherein,
   the gate curvature is defined by a radius extending from a point inside the first terminal.

3. The MOSFET of claim 1 wherein,
   the gate curvature of the gate is defined by a radius extending from a point inside the first terminal, the gate curvature is less than a semicircle.

4. The MOSFET of claim 1 wherein,
   the gate curvature is defined by a radius extending from a point inside the first terminal, the gate curvature is a quarter circle.

5. The MOSFET of claim 1 wherein,
   the gate curvature is defined by a radius extending from a point inside the first terminal, the gate curvature is an eighth circle.

6. The MOSFET of claim 1 wherein,
   the gate curvature of the gate is defined by a radius extending from a point inside the first terminal, the gate curvature is less than or equal to a quartercircle.

7. A MOSFET for receiving an applied voltage and a gate voltage, the MOSFET comprising,
   a source terminal in n-type silicon,
   a gate terminal receiving the gate voltage, the gate being disposed over a channel of the n-type silicon, the gate being insulated from the n-type silicon, the channel having two channel ends, the two channel ends being nonparallel nonaligned channel ends, the curve of the gate and the channel are noninflecting,
   an insulator disposed between the gate and the n-type silicon, and
   a drain terminal in the n-type silicon, the applied voltage extends between the source terminal and the drain terminal, the gate voltage serving to control conduction between the source terminal and the drain terminal in the presence of the gate voltage, the applied voltage serving to establish a diverging electric field extending from the source terminal through the channel to the drain terminal, the MOSFET being a triode MOSFET, the gate terminal and second terminal are coextensive in length.

8. The MOSFET of claim 7 further comprising,
   a silicon substrate,
   a p-type well disposed within the substrate, the source terminal and drain terminal and channel being disposed in the p-type well.

9. The MOSFET of claim 7 wherein,
   the curve of the gate is defined by a radius extending from a point inside the source terminal.

10. The MOSFET of claim 7 wherein,
    the gate curvature is defined by a radius extending from a point inside the source terminal, the gate curvature is less than a semicircle.

11. The MOSFET of claim 7 wherein,
    the gate curvature is defined by a radius extending from a point inside the source terminal, the gate curvature is a quarter circle.

12. The MOSFET of claim 7 further comprising,
    a p-type silicon well.

13. The MOSFET of claim 7 further comprising,
    a source connector,
    a source contact in the source connector for connecting the source connector to the source terminal,
    a drain connector, and
    a drain contact in the drain connector for connecting the drain connector to the drain terminal, the applied voltage being applied between the source connector and the drain connector.

14. The MOSFET of claim 7 further comprising,
    a source connector,
    a source contact in the source connector for connecting the source connector to the source terminal,
    a drain connector, and
    a plurality of drain contacts in the drain connector for connecting the drain connector to the drain terminal, the applied voltage being applied between the source connector and the drain connector.

15. The MOSFET of claim 7 further comprising,
    a p-type silicon well,
    a source connector,
    a source contact in the source connector for connecting the source connector to the source terminal,
    a drain connector, and
    a drain contact in the drain connector for connecting the drain connector to the drain terminal, the applied voltage being applied between the source connector and the drain connector.

16. The MOSFET of claim 7 further comprising,
a p-type silicon well,
a source connector,
a source contact in the source connector for connecting the source connector to the source terminal,
a drain connector, and
a plurality of drain contacts in the drain connector for connecting the drain connector to the drain terminal, the applied voltage being applied between the source connector and the drain connector.

17. The MOSFET of claim 7 wherein,
the gate curvature of the gate is defined by a radius extending from a point inside the first terminal, the gate curvature is less than or equal to a quartercircle.

* * * * *